(12) United States Patent
Choi et al.

(10) Patent No.: US 11,124,893 B2
(45) Date of Patent: Sep. 21, 2021

(54) METHOD OF TREATING A SINGLE CRYSTAL SILICON INGOT TO IMPROVE THE LLS RING/CORE PATTERN

(71) Applicant: GlobalWafers Co., Ltd., Hsinchu (TW)

(72) Inventors: WonJin Choi, Cheonan (KR); JunHwan Ji, Cheonan (KR); UiSung Jung, Cheonan (KR); JungHan Kim, Cheonan (KR); YoungJung Lee, Cheonan (KR); ChanRae Cho, Cheonan (KR)

(73) Assignee: GlobalWafers Co., Ltd., Hsinchu (TW)

( * ) Notice: Subject to any disclaimer, the term of this patent is extended or adjusted under 35 U.S.C. 154(b) by 302 days.

(21) Appl. No.: 16/214,381

(22) Filed: Dec. 10, 2018

(65) Prior Publication Data

US 2019/0194821 A1    Jun. 27, 2019

Related U.S. Application Data

(60) Provisional application No. 62/608,624, filed on Dec. 21, 2017.

(51) Int. Cl.
| | | |
|---|---|---|
| *C30B 29/06* | (2006.01) | |
| *H01L 21/02* | (2006.01) | |
| *C30B 33/08* | (2006.01) | |
| *C30B 33/02* | (2006.01) | |
| *H01L 21/324* | (2006.01) | |

(52) U.S. Cl.
CPC ............. *C30B 29/06* (2013.01); *C30B 33/02* (2013.01); *C30B 33/08* (2013.01); *H01L 21/02013* (2013.01); *H01L 21/324* (2013.01)

(58) Field of Classification Search
CPC .......... C30B 15/00; C30B 33/00; C30B 29/06
See application file for complete search history.

(56) References Cited

U.S. PATENT DOCUMENTS

| | | | |
|---|---|---|---|
| 4,193,783 A | 3/1980 | Matsushita | |
| 6,573,159 B1 | 6/2003 | Kobayashi et al. | |
| 7,387,676 B2 | 6/2008 | Von Ammon et al. | |
| 9,202,711 B2 | 12/2015 | Liu et al. | |
| 9,337,013 B2 | 5/2016 | Fusegawa et al. | |
| 2002/0009862 A1 | 1/2002 | Mun | |
| 2002/0022351 A1* | 2/2002 | Schmolke | C30B 29/06 438/504 |
| 2002/0173173 A1 | 11/2002 | Kobayashi et al. | |
| 2004/0192071 A1 | 9/2004 | Kobayashi et al. | |

(Continued)

FOREIGN PATENT DOCUMENTS

| | | |
|---|---|---|
| CN | 1632919 A | 6/2005 |
| CN | 1836062 A | 9/2006 |

(Continued)

OTHER PUBLICATIONS

International Search Report and Written Opinion of the International Searching Authority regarding PCT/US2018/064765 dated Feb. 12, 2019; pp. 1-14.

(Continued)

*Primary Examiner* — Robert M Kunemund
(74) *Attorney, Agent, or Firm* — Armstrong Teasdale LLP

(57) ABSTRACT

A method is disclosed for reducing the size and density of defects in a single crystal silicon wafer. The method involves subjected a single crystal silicon ingot to an anneal prior to wafer slicing.

29 Claims, 1 Drawing Sheet

| Test Condition | Before Heat treatment | After Heat treatment (500°C 1hr) | Before Heat treatment | After Heat treatment (900°C 2hr) |
|---|---|---|---|---|
| 37nm | | | | |
| 47nm | | | | PATTERN DISAPPEARED |
| Heat treatment | No | | No | |

(56) References Cited

U.S. PATENT DOCUMENTS

| | | |
|---|---|---|
| 2004/0231759 A1 | 11/2004 | Kobayashi et al. |
| 2005/0025691 A1 | 2/2005 | Kobayashi et al. |
| 2005/0039671 A1 | 2/2005 | Watanabe et al. |
| 2005/0247259 A1* | 11/2005 | Yoon .................. C30B 29/06 117/13 |
| 2006/0027159 A1 | 2/2006 | Shibayama et al. |
| 2006/0075957 A1 | 4/2006 | Takeno et al. |
| 2006/0150894 A1 | 7/2006 | Kobayaski |
| 2007/0059904 A1 | 3/2007 | Izumome |
| 2008/0026232 A1 | 1/2008 | Knerer et al. |
| 2010/0025624 A1* | 2/2010 | Nakashima ....... H01L 21/02019 252/79.5 |
| 2011/0031592 A1* | 2/2011 | Ishibashi .............. C30B 33/00 257/627 |
| 2011/0318546 A1 | 12/2011 | Knerer et al. |
| 2012/0100701 A1* | 4/2012 | Kawasaki ......... H01L 21/02052 438/478 |
| 2015/0236096 A1* | 8/2015 | Li ......................... C30B 29/06 428/192 |

FOREIGN PATENT DOCUMENTS

| | | |
|---|---|---|
| CN | 1896339 A | 1/2007 |
| CN | 104726931 A | 6/2015 |
| CN | 105431936 A | 3/2016 |
| WO | 0022198 A1 | 4/2000 |

OTHER PUBLICATIONS

Search Report and Written Opinion prepared by the Intellectual Property Office of Singapore regarding Singapore Patent Application No. 11202004283S dated Jul. 15, 2021, pp. 1-10.

* cited by examiner

| Test Condition | Before Heat treatment | After Heat treatment (500°C 1hr) | Before Heat treatment | After Heat treatment (900°C 2hr) |
|---|---|---|---|---|
| 37nm | (image) | (image) | (image) | (image) |
| 47nm | (image) | (image) | (image) | (image) |
| Heat treatment | No | (image) | No | PATTERN DISAPPEARED (image) |

METHOD OF TREATING A SINGLE CRYSTAL SILICON INGOT TO IMPROVE THE LLS RING/CORE PATTERN

CROSS REFERENCE TO RELATED APPLICATION(S)

This application claims the benefit of priority to U.S. provisional Application Ser. No. 62/608,624, filed Dec. 21, 2017, the disclosure of which is incorporated by reference as if set forth in its entirety.

FIELD OF THE INVENTION

The field of the present disclosure relates generally to a method of treating single crystal silicon ingots in order to reduce the size and density of defects in a single crystal silicon wafer sliced from the treated ingot.

BACKGROUND OF THE INVENTION

Single crystal material, which is the starting material for fabricating many electronic components such as semiconductor devices and solar cells, is commonly prepared using the Czochralski ("CZ") method. Briefly, the Czochralski method involves melting polycrystalline source material, such as polycrystalline silicon ("polysilicon"), in a crucible to form a silicon melt, and then pulling a single-crystal ingot from the melt.

Semiconductor wafers are generally prepared from a single crystal ingot (e.g., a silicon ingot) which is processed to remove the seed cone and the end cone and then trimmed, optionally cropped, and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

The continuously shrinking size of modern electronic devices imposes challenging restrictions on the quality of the silicon substrate, which is determined, at least in part, by the size and the distribution of the grown-in microdefects. Most of the microdefects formed in silicon crystals grown by the Czochralski process are agglomerates of intrinsic point defects of silicon (i.e., vacancies and self-interstitials) or oxide precipitates.

Attempts to produce substantially defect-free single crystal silicon often include controlling the ratio of the crystal pull-rate (v) to the magnitude of the axial temperature gradient in the vicinity of the melt/crystal interface (G). For example, some known methods include controlling the v/G ratio near a critical v/G value at which vacancies and interstitials are incorporated into the growing crystal ingot in very low and comparable concentrations, mutually annihilating each other and thus suppressing the potential formation of any microdefects at lower temperatures. However, as described in U.S. Pat. No. 8,673,248 to Kulkarni, controlling the v/G ratio near such a critical v/G value may form an annular ring or "band" of relatively large and/or concentrated agglomerated defects (such as voids and oxygen precipitates) extending a distance radially inward from the lateral surface or circumferential edge of the silicon crystal ingot, referred to herein as a "defect edge band" or simply, "defect band".

Such a defect band is generally of lower quality than other portions of the silicon crystal ingot located radially inward from the defect band, and can significantly reduce the yield of the crystal ingot. For example, increasingly stringent requirements on the quality of wafers for memory devices have increased the required breakdown voltage for gate oxide integrity (GOI) tests, used to evaluate the quality of silicon or semiconductor wafers for application in memory devices (e.g., SRAM, DRAM). As a result, more GOI failures occur near or within the defect edge band of substantially defect-free silicon wafers, reducing the yield.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY OF THE INVENTION

In one aspect, the present invention is directed to a method of processing a single crystal silicon ingot, the method comprising: grinding the single crystal silicon ingot, wherein the single crystal silicon ingot comprises a seed end, a tail end opposite the seed end, and a main body between the seed end and the tail end, wherein the main body is ground to a constant diameter; annealing the ground single crystal silicon ingot for a temperature and duration sufficient to reduce the size or number of localized laser scattering defects on a wafer sliced from the single crystal silicon ingot; and slicing the annealed single crystal silicon ingot into at least two single crystal silicon wafers.

The present invention is further directed to a method of processing a single crystal silicon ingot, the method comprising: removing a seed cone and a tail cone from the single crystal silicon ingot, wherein the single crystal silicon ingot comprises the seed cone, the tail cone opposite the seed cone, and a main body between the seed cone and the tail cone; cropping the main body of the single crystal silicon ingot so that the main body of the single crystal silicon ingot comprises one or more single crystal silicon segments, wherein the thickness of a segment is at least about 1 cm, at least about 10 cm, or at least about 20 cm; annealing one or more of the cropped single crystal silicon segments for a temperature and duration sufficient to reduce the size or number of localized laser scattering defects on a wafer sliced from the single crystal silicon segment; and slicing the annealed single crystal silicon segment into at least two single crystal silicon wafers.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

FIG. 1 is a table depicting the reduction of LLS ring/core pattern defects in single crystal silicon segments before and after anneal at two temperatures and two durations. The defects were measured under the 37 nm and 47 nm test condition.

DETAILED DESCRIPTION OF THE INVENTION

The methods described herein facilitate reducing the size and concentration of defects that form in monocrystalline ingots grown by the Czochralski method, such as single crystal silicon ingots. Accordingly, the method of the present invention is sufficient to remove defect patterns that impact the device yield. Without being bound to a particular theory, wafers sliced from an ingot may have a laser light scattering (LLS) ring/core pattern, the source of which has been considered to defects which were made during crystal pulling or etch pits which were made from polished wafering process. The LLS ring/core pattern may only be detected after the wafer has been sliced and during LLS ring/core pattern measuring, which is one of the last process step in wafering technology. Conventionally, a heat treatment performed upon the sliced wafers was performed to remove defects associated with the LLS ring/core pattern. According to the method of the present invention, an ingot in the rod state is subjected to an anneal before wafer slicing. This anneal has several merits, including reduction in the size and density of defects that make up the LLS ring/core pattern, time and cost savings compared to heat treating individual wafers, reduced contamination due to rod state heat treatment, and uniformity since an entire ingot or ingot section is heated, rather than individual wafers.

Single crystal silicon ingots for use in the method of the present invention may have any length and diameter obtainable by the Czochralski method. In some embodiments, the diameters of the ingot may be at least about 100 mm, at least about 200 mm, such as at least about 300 mm, at least about 400 mm, or even at least about 450 mm, such as between about 150 mm to about 450 mm. In some embodiments, the length of ingot is at least 25 cm, such as at least about 50 cm, at least about 75 cm, at least about 100 cm, at least about 150 cm, or even at least about 200 cm, such as between about 100 cm and about 300 cm. In some embodiments, ingots having these lengths and diameters may be at least about 15 kg in mass, or at least about 100 kg in mass, such as at least about 200 kg, at least about 300 kg, at least about 400 kg, at least about 500 kg, at least about 600 kg, at least about 700 kg, or even at least about 800 kg in mass, such as between about 15 kilograms (kg) and about 450 kg, such as between about 150 kg and about 450 kg. Single crystal silicon ingots grown by the Czochralski method comprise a seed cone at the seed end and a tail cone at the tail end opposite the seed end. The ingot also comprises a main body portion between the seed end and the tail end. After ingot growth, the single crystal silicon ingots may be cooled to a temperature that allows handling. Although the method of the invention may be applied to an as-grown ingot, in general, the seed cone and the tail cone will be removed from the ingot prior to the method of the present invention.

In some embodiments, the single crystal silicon ingots, having the seed cone and tail cone removed, may be cropped into one or more single crystal silicon segments. The single crystal silicon ingots may also be trimmed to have an orientation flat or a notch at a part of the peripheral to indicate the crystal orientation. The thickness of any one of the one or more single crystal silicon segments may be at least about 1 cm, at least about 10 cm, at least about 20 cm, or at least about 50 cm. In general, the thickness of a segment is less than about 1 m, less than about 50 cm, or less than about 40 cm, or less than 30 cm. In some embodiments, the thickness of a segment is between about 10 cm and about 30 cm.

In some embodiments, the ingot may be subjected to grinding sufficient to produce an ingot having a main body having a constant diameter region. Grinding may occur on the entire single crystal silicon ingot, i.e., before cropping. The length of an uncropped ingot may be at least about 1 cm, at least about 10 cm, at least about 20 cm, or at least about 1 m, such as between about 1 m and about 3 m. Such ingots may weigh between about 15 kilograms (kg) and about 450 kg, such as between about 150 kg and about 450 kg. Ingots having diameters less than 150 mm or greater than 450 mm, or charge sizes other than between about 15 kilograms (kg) and about 450 kg, such as between about 150 kg and about 450 kg may also be grown using the systems and methods disclosed herein. Alternatively, a cropped segment may be ground to a constant diameter region. The thickness of any one of the one or more single crystal silicon segments may be at least about 1 cm, at least about 10 cm, at least about 20 cm, or at least about 50 cm. In general, the thickness of a segment is less than about 1 m, less than about 50 cm, or less than about 40 cm, or less than about 30 cm. In some embodiments, the thickness of a segment is between about 10 cm and about 30 cm. A machine employing a grindwheel shapes the ingot to the precision needed for wafer diameter control. Other grinding wheels are then used to carve a characteristic notch or a flat in order to define the proper orientation of the future wafer versus a particular crystallographic axis. The diameter of the constant diameter region may be at least about 150 mm, at least about 200 mm, at least about 300 mm, or at least about 450 mm, such as between about 150 mm to about 450 mm.

During the growth process, the crucible slowly dissolves oxygen into the melt that is incorporated into the final crystal ingot. In some embodiments, the ingot or any single crystal silicon wafer sliced therefrom may comprise interstitial oxygen in concentrations that are generally achieved by the Czochralski-growth method. In some embodiments, the ingot or any single crystal silicon wafer sliced therefrom comprise oxygen in a concentration between about 4 PPMA (about $2\times10^{17}$ atoms/cm$^3$) and about 18 PPMA (about $9\times10^{17}$ atoms/cm$^3$). In some embodiments, the semiconductor wafers comprise oxygen in a concentration between about 4 PPMA (about $2\times10^{17}$ atoms/cm$^3$) and about 45 PPMA (about $2.2\times10^{18}$ atoms/cm$^3$), such as between about 10 PPMA (about $5\times10^{17}$ atoms/cm$^3$) and about 35 PPMA (about $1.7\times10^{18}$ atoms/cm$^3$). Preferably, the ingot or any single crystal silicon wafer sliced therefrom comprises oxygen in a concentration of no greater than about 12 PPMA (about $6\times10^{17}$ atoms/cm$^3$), such as less than about 10 PPMA (about $5\times10^{17}$ atoms/cm$^3$). Interstitial oxygen may be measured according to SEMI MF 1188-1105.

Typical carbon concentrations in ingots grown by the Czochralski-growth method may be less than about $1.0\times10^{16}$ atoms/cm$^3$, such as between about $2\times10^{15}$ atoms/cm$^3$ and about $1.0\times10^{16}$ atoms/cm$^3$, or between about $5\times10^{15}$ atoms/cm$^3$ and about $1.0\times10^{16}$ atoms/cm$^3$.

Intentional additions of dopants control the resistivity distribution of the final crystal. In general, there are no constraints on the resistivity of the ingot or any single crystal silicon wafer sliced therefrom. Instead, the resistivity of the ingot, segment, and wafers sliced therefrom are determined by the end use of the wafer. The ingot, segment, or any single crystal silicon wafer sliced therefrom may have any resistivity obtainable by the Czochralski or float zone methods. Accordingly, the resistivity of the ingot, segment, or any single crystal silicon wafer sliced therefrom is based on the requirements of the end use/application of the structure of the present invention. The resistivity may therefore vary from milliohm or less to megaohm or more. In some embodiments, the ingot or any single crystal silicon wafer sliced therefrom comprises a p-type or an n-type dopant. Suitable dopants include p-type dopants such as boron, aluminum, gallium and indium and n-type dopants such as phosphorous, arsenic and antimony. The dopant concentration is selected based on the desired resistivity. In some embodiments, the ingot, segment, or any single crystal silicon wafer sliced therefrom comprises a p-type dopant, such as boron. In some embodiments, the ingot, segment, or any single crystal silicon wafer sliced therefrom comprises a n-type dopant, such as arsenic or phosphorus.

In some embodiments, the ingot, segment, or any single crystal silicon wafer sliced therefrom has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the ingot, segment, or any single crystal silicon wafer sliced therefrom has a relatively low minimum bulk resistivity, such as below about 100 ohm-cm, or between about 1 ohm-cm and about 100 ohm-cm, such as between about 0.01 ohm-cm and about 100 ohm-cm. Low resistivity wafers may comprise electrically active dopants, such as p-type dopants such as boron, aluminum, gallium and indium and/or n-type dopants such as phosphorous, arsenic and antimony.

In some embodiments, the ingot, segment, or any single crystal silicon wafer sliced therefrom has a relatively high minimum bulk resistivity. High resistivity ingots, segments, or wafers may comprise electrically active dopants, such as p-type dopants such as boron, aluminum, gallium and indium and/or n-type dopants such as phosphorous, arsenic and antimony, in generally very low concentrations. In some embodiments, the ingot, segment, or any single crystal silicon wafer sliced therefrom has a minimum bulk resistivity of at least 100 Ohm-cm, at least about 500 Ohm-cm, at least about 1000 Ohm-cm, or even at least about 3000 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm.

The ingot, segment, or any single crystal silicon wafer sliced therefrom may have any of (100), (110), or (111) crystal orientation, and the choice of crystal orientation may be dictated by the end use of the structure.

The single crystal silicon ingot, or a cropped segment thereof, is subjected to an anneal prior to wafer slicing. The anneal may occur on an ingot that still has the seed cone and end cone in place, having the seed cone and end cone removed, or a cropped segment thereof may be annealed. The anneal occurs at a temperature and duration sufficient to reduce the defects that are found in the LLS ring/core pattern in a wafer sliced from the annealed ingot or segment. Advantageously, other defects may be reduced as well. The anneal may occur in a furnace, e.g., a box furnace suitable for industrial or laboratory use. The anneal ambient atmosphere is generally inert, i.e., non-hydriding and/or non-oxidizing. In some embodiments, the atmosphere may comprise argon, nitrogen, or a combination of argon and nitrogen. In some embodiments, the ambient atmosphere comprises argon. In some embodiments, the ambient atmosphere consists essentially of argon at high purity, such as at least about 99 vol. %, at least about 99.9 vol. %, at least about 99.99 vol. % or even at least about 99.999 vol. %. In some embodiments, the ambient atmosphere comprises nitrogen. In some embodiments, the ambient atmosphere consists essentially of nitrogen at high purity, such as at least about 99 vol. %, at least about 99.9 vol. %, at least about 99.99 vol. % or even at least about 99.999 vol. %. In some embodiments, the ambient atmosphere comprises a combination of argon and nitrogen, wherein the nitrogen content may vary from between about 1 vol. % to about 99 vol. %, such as between about 10 vol. % and about 90 vol. %, or between about 20 vol. % and about 80 vol. %, with the balance being argon. In some embodiments, the anneal temperature is at least about 600° C., such as between about 600° C. and about 1200° C., or between about 600° C. and about 1000° C., or between about 600° C. and about 900° C., or between about 700° C. and about 900° C. In some embodiments, the single crystal silicon ingot or segment thereof is annealed for a duration of at least about 1 hour, such as between about 1 hour and about 6 hours, such as between about 1 hour and about 4 hours, or between about 1 hour and about 3 hours, or for a duration of about 2 hours.

After anneal and cooling to a temperature sufficient to permit handling, individual wafers are sliced from the heat treated ingot. Wafer shaping involves a series of precise mechanical and chemical process steps that are necessary to turn the ingot segment into a functional wafer. It is during these steps that the wafer surfaces and dimensions are perfected to exacting detail. Each step is designed to bring the wafer into compliance with customer specification. The first of these critical steps is Multi-Wiring Slicing. The dominant state of the art slicing technology is Multi-Wire Sawing (MWS). Here, a thin wire is arranged over cylindrical spools so that hundreds of parallel wire segments simultaneously travel through the ingot. While the saw as a whole slowly moves through the ingot, the individual wire segments conduct a translational motion always bringing fresh wire into contact with the Silicon. The sawing effect is actually achieved by SiC or other grinding agents that run along the rotating wire. After MWS the wafers are cleaned and consolidated into process lots and transported to the next operation. The sideward deflection of the wire saw can lead to marks or "waviness" on the wafer surface and wire-to-wire thickness variations cause wafer thickness variations of up to several microns. Wafers are thus exposed to a complex polishing process. At least two wafers are sliced from the annealed ingot or segment, each wafer comprising two major, generally parallel surfaces, one of which is a front surface of the single crystal silicon wafer and the other of which is a back surface of the single crystal silicon wafer, a circumferential edge joining the front and back surfaces of the single crystal silicon wafer, a central plane between and parallel to the front surface and the back surface of the single crystal silicon wafer, a central axis perpendicular to the central plane, and a bulk region between the front and back surfaces of the single crystal silicon wafer. Each wafer has a thickness as measured between the front and back surfaces of the single crystal silicon wafer and along the central axis is less than about 1500 micrometers. A typical segment, e.g., one having a length between about 10 cm and about 30 cm, may be sliced into between about 2 wafers and about 400 wafers, such as between about 2 and about 300 wafers, or between about 10 and about 300 wafers, or between about 50 and about 300 wafers.

Front surface polishing is performed generally in a two-step process. One mechanical polishing step (lapping) to create flatness followed by a chemical etch to create smoothness. After polishing, the wafers are subjected to a final clean. Lapping the wafers removes saw marks and surface defects from the front and backside of the wafers, thins the wafer to spec and relieves much of the stress accumulated in the wafer during the sawing process. Objectives of lapping include removing subsurface damage in sliced wafers, thinning wafers to target thickness, and achieving a high degree of parallelism and flatness of wafer surfaces. Both single-side and double-side lapping processes may be used to lap substrate wafers. In double-side lapping (DSL), loose abrasive particles are suspended in a colloidal slurry to abrade material from wafer surfaces. Wafers are held in geared carriers which are driven in the planetary motion. After a batch of wafers is manually loaded into the holes of the carriers, the upper plate will be forced down by a certain pressure (or weight), e.g., from about 1 kg to about 30 kg, or from about 5 kg to about 20 kg, such as about 10 kg. The two plates start to rotate either in the same direction or opposite directions. During double-side lapping, both sides of the wafers are lapped simultaneously. The colloidal slurry is continuously filled into the lapping machine, and a thin film of slurry is usually present between wafers and the two plates. The slurry performs the material removal through the abrasive grits as they slide or roll between wafer surfaces and the two plates. The lapping may occur for at least 1 minute, at least 5 minutes, at least 10 minutes, at least 15 minutes, at least 20 minutes, at least 25 minutes, such as about 10 minutes. Lapping parameters including lapping pressure, plate rotation speed, plate material, abrasive material and grain size, slurry concentration, slurry flow rate, and carrier design may be according to conventional techniques. For example, the particle sizes in the lapping slurry may range from about 1 to about 250 micrometers, such as between about 1 to about 50 micrometers, such as between about 5 and about 20 micrometers. Rotation rates may range from about 10 to about 150 rpm, or about 25 to about 150 rpm, such as about 50 rpm, about 75 rpm, or about 100 rpm. In some embodiments, the wafers may be contacted with an alumina ($Al_2O_3$) slurry. In some embodiments, the wafers may be contacted with a slurry comprising monocrystalline diamond particles. In some embodiments, the wafers may be contacted with a slurry comprising boron carbide particles. In some embodiments, the wafers may be contacted with a slurry comprising silicon carbide particles.

Edge rounding is normally done before or after lapping and is very important to the structural integrity of the wafer. The edge grinding step is critical to the safety of the wafer edge. Single crystal silicon is very brittle and if the edge is not profiled or rounded off, flaking may occur during handling. Edge flaking is adversely affects not only the individual wafer, but it can effect other wafers that are being processed if the edge flake contaminates the processing equipment or nearby wafers. The edges of 200 mm and 300 mm wafers are rounded even in the notch area. This edge is ground with a diamond disk to remove the damages and eliminate peripheral stress. By edge grinding, the final diameter of the wafer is adjusted (Accuracy up to 0.02 mm).

After a final clean and polish, wafers are ready for a final inspection before delivery. Individual wafer flatness and surface particles are measured using specially designed inspection tools to assure wafer quality. The method of the present invention enables a reduction in the defects characteristic of the LLS ring/core pattern. In some embodiment, the number of defects in the LLS ring/core pattern may be reduced by at least about 50%, such as at least about 60%, at least about 70%, or even at least about 80%, using the 37 nm LLS size criteria.

Example 1

A single crystal silicon ingot grown by the Czochralski method was cropped into segments by a crop-saw. The silicon ingot was grown under conditions to achieve the standards of Perfect Silicon™ (SunEdison Semiconductor, Ltd.). These standards include an ingot that is free of agglomerated defects, DSOD (direct surface oxidation defects), COP (crystal originated pits), D-Defects, and I-defects, etc. The oxygen concentration was less than $6.0 \times 10^{17}$ atoms/cm$^3$ (about 12 PPMA).

The cropped segments may be ground to a have a constant diameter main body. Alternatively, the cropped segments may be annealed prior to grinding. The segments were loaded into a box furnace (TCM, STC80K-CT). In some instances, the segments were annealed at 500° C. in a nitrogen atmosphere for one hour. In some instances, the segments were annealed at 900° C. for two hours. The annealed segments were then sliced by wire sawing into individual wafers and analyzed for LLS ring/core defect patterns.

The 37 nm (LLS bin size) and 47 nm (LLS bin size) LLS patterns were not removed in heat treatment at 500° C. for 1 hr. See FIG. 1, second and third columns. These columns depict the wafer defect pattern of an average of wafers sliced from the segment before anneal and an average of 25 wafers sliced from an annealed segment. As shown in FIG. 1, the defect density was not lowered significantly from the low temperature, short duration anneal. Each 25 wafer LLS image which was stacked each other was investigated after polishing and cleaning step and each 25 images between before and after results is also sister cassette which means each cassette images are same images and quality before heat treatment. The longer duration anneal at the higher temperature reduced the number of defects and caused the pattern to disappear, and LLS ring/core patterns was fully removed at rod heat treatment condition in 900° C. for 2 hr. See FIG. 1, fourth and fifth columns. For these wafers, the LLS defect number average decreased from 157 defects per wafer to 24 defects per wafer according to the 37 nm LLS size criteria.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A method of processing a single crystal silicon ingot, the method comprising:
grinding the single crystal silicon ingot, wherein the single crystal silicon ingot comprises a seed end, a tail end opposite the seed end, and a main body between the seed end and the tail end, wherein the main body is ground to a constant diameter, wherein the diameter of the main body of the single crystal silicon ingot is at least about 150 mm;

annealing the ground single crystal silicon ingot for a temperature and duration sufficient to reduce the size or number of localized laser scattering defects on a wafer sliced from the single crystal silicon ingot, wherein the single crystal silicon ingot is annealed at a temperature of at least about 600° C. and for a duration of at least about 1 hour, and further wherein the single crystal silicon ingot is annealed in an ambient atmosphere comprising argon, nitrogen, or a combination of argon and nitrogen; and slicing the annealed single crystal silicon ingot into at least two single crystal silicon wafers.

2. The method of claim 1 wherein the single crystal silicon ingot is grown by the Czochralski process, and the single crystal silicon ingot is cooled before grinding, and further wherein the single crystal silicon ingot comprises oxygen in a concentration between about 4 PPMA (about $2\times10^{17}$ atoms/cm$^3$) and about 18 PPMA (about $9\times10^{17}$ atoms/cm$^3$).

3. The method of claim 1 wherein the diameter of the main body of the single crystal silicon ingot is at least about 300 mm.

4. The method of claim 1 further comprising the step of cropping the single crystal silicon ingot into one or more segments, wherein the thickness of a segment is at least about 1 cm.

5. The method of claim 1 further comprising the step of cropping the single crystal silicon ingot into one or more segments, wherein the thickness of a segment is less than about 1 m.

6. The method of claim 1 further comprising the step of cropping the single crystal silicon ingot into one or more segments, wherein the thickness of a segment is between about 10 cm and about 30 cm.

7. The method of claim 1 wherein each single crystal silicon wafer sliced from the annealed ingot comprises two major, generally parallel surfaces, one of which is a front surface of the single crystal silicon wafer and the other of which is a back surface of the single crystal silicon wafer, a circumferential edge joining the front and back surfaces of the single crystal silicon wafer, a central plane between and parallel to the front surface and the back surface of the single crystal silicon wafer, a central axis perpendicular to the central plane, and a bulk region between the front and back surfaces of the single crystal silicon wafer, wherein each wafer has a thickness as measured between the front and back surfaces of the single crystal silicon wafer and along the central axis is less than about 1500 micrometers.

8. The method of claim 1 wherein the annealed single crystal silicon ingot is sliced into at between about two single crystal silicon wafers and about 300 single crystal silicon wafers.

9. The method of claim 1 wherein the annealed single crystal silicon ingot is sliced into about 300 single crystal silicon wafers.

10. The method of claim 1 wherein the single crystal silicon ingot is annealed in an ambient atmosphere comprising nitrogen.

11. The method of claim 1 wherein the single crystal silicon ingot is annealed in an ambient atmosphere consisting essentially of nitrogen.

12. The method of claim 1 wherein the single crystal silicon ingot is annealed at a temperature between about 600° C. and about 1000° C.

13. The method of claim 1 wherein the single crystal silicon ingot is annealed at a temperature between about 600° C. and about 900° C.

14. The method of claim 1 wherein the single crystal silicon ingot is annealed for a duration between about 1 hour and about 4 hours.

15. The method of claim 1 wherein the single crystal silicon ingot is annealed for a duration of about 2 hours.

16. A method of processing a single crystal silicon ingot, the method comprising:

removing a seed cone and a tail cone from the single crystal silicon ingot, wherein the single crystal silicon ingot comprises the seed cone, the tail cone opposite the seed cone, and a main body between the seed cone and the tail cone, wherein the diameter of the main body of the single crystal silicon ingot is at least about 150 mm;

cropping the main body of the single crystal silicon ingot so that the main body of the single crystal silicon ingot comprises one or more single crystal silicon segments, wherein the thickness of a segment is at least about 1 cm;

annealing one or more of the cropped single crystal silicon segments for a temperature and duration sufficient to reduce the size or number of localized laser scattering defects on a wafer sliced from the single crystal silicon segment, wherein the one or more of the cropped single crystal silicon segment is annealed at a temperature of at least about 600° C. and for a duration of at least about 1 hour, and further wherein the one or more cropped single crystal silicon segment is annealed in an ambient atmosphere comprising argon, nitrogen, or a combination of argon and nitrogen; and slicing the annealed single crystal silicon segment into at least two single crystal silicon wafers.

17. The method of claim 16 wherein the single crystal silicon ingot is grown by the Czochralski process, and further wherein the single crystal silicon ingot comprises oxygen in a concentration between about 4 PPMA (about $2\times10^{17}$ atoms/cm$^3$) and about 18 PPMA (about $9\times10^{17}$ atoms/cm$^3$).

18. The method of claim 16 further comprising grinding the main body of the single crystal silicon segment, wherein the main body is ground to a constant diameter of at least about 300 mm.

19. The method of claim 16 wherein the thickness of a single crystal silicon segment is less than about 1 m.

20. The method of claim 16 wherein the thickness of a single crystal silicon segment is between about 10 cm and about 30 cm.

21. The method of claim 16 wherein each single crystal silicon wafer sliced from the annealed single crystal silicon segment comprises two major, generally parallel surfaces, one of which is a front surface of the single crystal silicon wafer and the other of which is a back surface of the single crystal silicon wafer, a circumferential edge joining the front and back surfaces of the single crystal silicon wafer, a central plane between and parallel to the front surface and the back surface of the single crystal silicon wafer, a central axis perpendicular to the central plane, and a bulk region between the front and back surfaces of the single crystal silicon wafer, wherein each wafer has a thickness as measured between the front and back surfaces of the single crystal silicon wafer and along the central axis is less than about 1500 micrometers.

22. The method of claim 16 wherein the annealed single crystal silicon segment is sliced into at between about two single crystal silicon wafers and about 300 single crystal silicon wafers.

23. The method of claim 16 wherein the annealed single crystal silicon segment is sliced into about 300 single crystal silicon wafers.

24. The method of claim 16 wherein the single crystal silicon segment is annealed in an ambient atmosphere comprising nitrogen.

25. The method of claim 16 wherein the single crystal silicon segment is annealed in an ambient atmosphere consisting essentially of nitrogen.

26. The method of claim 16 wherein the single crystal silicon segment is annealed at a temperature between about 600° C. and about 1000° C.

27. The method of claim 16 wherein the single crystal silicon segment is annealed is annealed at a temperature between about 600° C. and about 900° C.

28. The method of claim 16 wherein the single crystal silicon segment is annealed for a duration between about 1 hour and about 4 hours.

29. The method of claim 16 wherein the single crystal silicon segment is annealed for a duration of about 2 hours.

* * * * *